(12) United States Patent
Luebke et al.

(10) Patent No.: US 10,884,068 B2
(45) Date of Patent: Jan. 5, 2021

(54) METHOD AND APPARATUS FOR MEASURING PROSPECTIVE SHORT CIRCUIT CURRENT

(71) Applicant: EATON CORPORATION, Cleveland, OH (US)

(72) Inventors: Charles J. Luebke, Hartland, WI (US); Amjad Hussain, Prague (CZ)

(73) Assignee: EATON INTELLIGENT POWER LIMITED, Dublin (IE)

( * ) Notice: Subject to any disclaimer, the term of this patent is extended or adjusted under 35 U.S.C. 154(b) by 513 days.

(21) Appl. No.: 15/797,213

(22) Filed: Oct. 30, 2017

(65) Prior Publication Data

US 2019/0128942 A1 May 2, 2019

(51) Int. Cl.
| | |
|---|---|
| G01R 31/50 | (2020.01) |
| G01R 19/25 | (2006.01) |
| H02H 3/02 | (2006.01) |
| G01R 27/18 | (2006.01) |
| G01R 31/327 | (2006.01) |

(52) U.S. Cl.
CPC ............. *G01R 31/50* (2020.01); *G01R 19/25* (2013.01); *G01R 27/18* (2013.01); *G01R 31/327* (2013.01); *H02H 3/023* (2013.01)

(58) Field of Classification Search
CPC ...... G01R 19/25; G01R 27/18; G01R 31/025; G01R 31/327; H02H 3/023
USPC .......................................................... 361/115
See application file for complete search history.

(56) References Cited

U.S. PATENT DOCUMENTS

| | | | | |
|---|---|---|---|---|
| 4,733,321 | A * | 3/1988 | Lindeperg | H02H 3/44 361/96 |
| 6,271,668 | B1 | 8/2001 | Sehdev et al. | |
| 7,791,351 | B2 | 9/2010 | Raber | |
| 8,493,012 | B2 | 7/2013 | Kellis et al. | |
| 2006/0071675 | A1* | 4/2006 | Batten | G01R 31/42 324/710 |
| 2008/0036472 | A1* | 2/2008 | Collins, Jr. | G01R 19/2513 324/649 |

(Continued)

FOREIGN PATENT DOCUMENTS

| | | |
|---|---|---|
| GB | 2 097 942 A | 11/1982 |
| GB | 2 413 192 A | 10/2005 |

OTHER PUBLICATIONS

Fluke (UK) Ltd, "Basic electrical installation testing", 2014, pp. 1-4, www.fluke.co.uk.

(Continued)

*Primary Examiner* — Kevin J Comber
(74) *Attorney, Agent, or Firm* — Eckert Seamans Cherin & Mellott, LLC

(57) ABSTRACT

A method of determining a prospective short circuit current for an electrical system including a source includes connecting a test load between either: (i) a first phase line and a second phase line of the electrical system or (ii) the first phase line and the neutral line of the electrical system, employing a sensor coupled to the electrical system to measure a voltage drop across the test load, determining a voltage value based on at least the measured voltage drop across the test load, determining a total effective impedance for the first phase line to the source, and determining the prospective short circuit current based on the voltage value and the total effective impedance.

16 Claims, 4 Drawing Sheets

(56) References Cited

U.S. PATENT DOCUMENTS

2008/0084213 A1 4/2008 Waite et al.

OTHER PUBLICATIONS

Fluke Europe B.V., "The importance of loop impedance testing", 2003, pp. 1-2, http://www.fluke.com.
John Frederic Whitfield, "The electrician's guide to the 16th edition of the IEE wiring regulations BS 7671", 5th ed., Section 8.6.2, Wendens Ambo : EPA, 2000, obtained from https://www.tlc-direct.co.uk/Book/8.6.2.htm.
European Patent Office, "International Search Report and Written Opinion" (corresp. to PCT/IB18/058054), dated Jan. 7, 2019, 13 pp.

\* cited by examiner

METHOD AND APPARATUS FOR MEASURING PROSPECTIVE SHORT CIRCUIT CURRENT

BACKGROUND

Field

The disclosed concept pertains generally to circuit protection devices, such as, without limitation, a circuit breaker, and, in particular, to a method and apparatus for dynamically determining the prospective short-circuit current of the circuit in which a circuit protection device is provided.

Background Information

Circuit protection devices, such as circuit breakers, are well known in the art. Circuit protection devices are used to protect the circuitry in an electrical system from damage due to an overcurrent condition, such as an overload condition or a relatively high level short circuit or fault condition. Such circuit protection devices have a short circuit current rating (SCCR), which identifies the maximum current the circuit protection device is rated to safely interrupt. When a circuit protection device is to be implemented in an electrical system, it is important to choose a circuit protection device that is properly rated for the system at the time of installation. The primary method for choosing a properly rated circuit protection device is to first determine what is known as the prospective short circuit (PSC) current for the electrical system, which is the highest electric current that can exist in the electrical system under short-circuit conditions, and then choose a circuit protection device that has an SCCR that is sufficient for the determined PSC current. In addition, the PSC current in an electrical system can dynamically change over time based on the source(s) present (e.g., PSC current may change due to a transfer from a utility feed to an inverter based distributed energy source). In such situations, it may be necessary to dynamically alter the settings of a circuit protection device to handle different PSC current levels as needed. It is therefore advantageous to be able to dynamically measure PSC current levels so that such adjustments can be made accordingly. PSC current is also used to calculate arc flash incident energy values in an electrical system, which values assist personnel by specifying arc flash hazards.

One known method for dynamically determining the PSC current in an electrical system is described in U.S. Pat. No. 8,493,012, owned by the assigned hereof. That method utilizes an existing switch (contactor) and the actual load in an electrical system in order to calculate the PSC current based on voltage and current measurements made before and after closing the switch to energize the load. More specifically, in that method, PSC current is calculated based on the resistance of the source, which results in a higher value of PSC current than the actual value based on total impedance (resistance+reactance). This is acceptable in terms of safety because it over-specifies the breaker rating and arc flash incident energy, but results in extra cost.

There is thus room for improvement in the field of dynamic measurement of PSC current.

SUMMARY

In one embodiment, a method of determining a prospective short circuit current for an electrical system including a source is provided. The method includes connecting a test load between either: (i) a first phase line and a second phase line of the electrical system or (ii) the first phase line and the neutral line of the electrical system, employing a sensor coupled to the electrical system to measure a voltage drop across the test load, determining a voltage value based on at least the measured voltage drop across the test load, determining a total effective impedance for the first phase line to the source, and determining the prospective short circuit current based on the voltage value and the total effective impedance.

In another embodiment, an electrical device structured to be coupled to an electrical system between a source and a load and for determining a prospective short circuit current is provided. The electrical device includes a test load, a switch structured to selectively connect the test load between either: (i) a first phase line and a second phase line of the electrical system or (ii) the first phase line and the neutral line of the electrical system, a sensor structured to generate a signal indicative of a voltage drop across the test load, and a controller structured and configured to determining a voltage value based on at least the signal indicative of a voltage drop across the test load, determine a total effective impedance for the first phase line, determine a prospective short circuit current for the electrical system based on the voltage value and the total effective impedance.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1A:
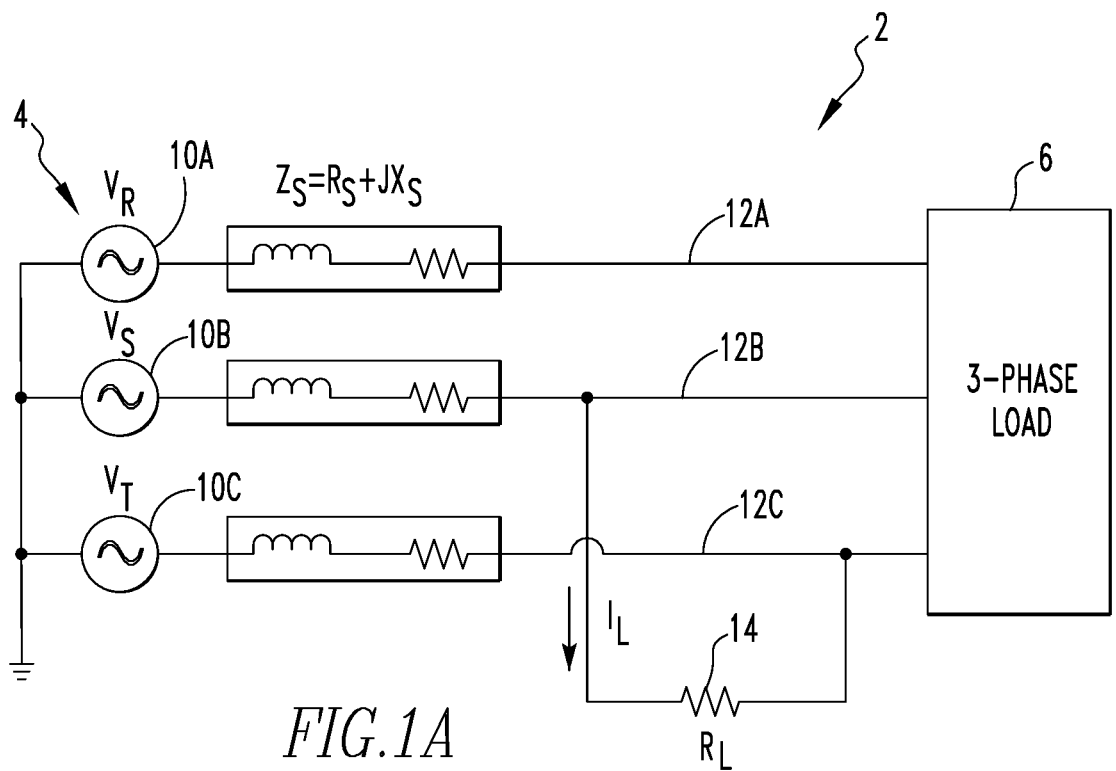
FIGS. 1A and 1B are schematic circuit diagrams of an electrical system which illustrate a method of determining the PSC current according to one exemplary embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As used herein, the term "number" shall mean one or an integer greater than one (i.e., a plurality).

As used herein, the statement that two or more parts are "coupled" together shall mean that the parts are joined together either directly or joined through one or more intermediate parts.

As used herein, the term "controller" shall mean a programmable analog and/or digital device (including an associated memory part or portion) that can store, retrieve, execute and process data (e.g., software routines and/or information used by such routines), including, without limitation, a field programmable gate array (FPGA), a complex programmable logic device (CPLD), a programmable system on a chip (PSOC), an application specific integrated circuit (ASIC), a microprocessor, a microcontroller, a programmable logic controller, or any other suitable processing device or apparatus. The memory portion can be any one or more of a variety of types of internal and/or external storage media such as, without limitation, RAM, ROM, EPROM(s), EEPROM(s), FLASH, and the like that provide a storage register, i.e., a non-transitory machine readable medium, for data and program code storage such as in the fashion of an internal storage area of a computer, and can be volatile memory or nonvolatile memory.

The disclosed concept provides two similar methods, namely a line-to-line method and a line-to-neutral method, that may be used to dynamically measure the PSC current ($I_{PSC}$) in an electrical system. As described in detail herein, both methods determine the PSC current based on a voltage that is measured across a test load, such as a test resistor, and a calculated value of the impedance from the test point to the source. The disclosed concept thus enables PSC current determinations to be made directly within an electrical device such as, without limitation, a circuit breaker, a protective relay, or a meter, at any time.

I. The Line-to-Line Method

Figure 1B:
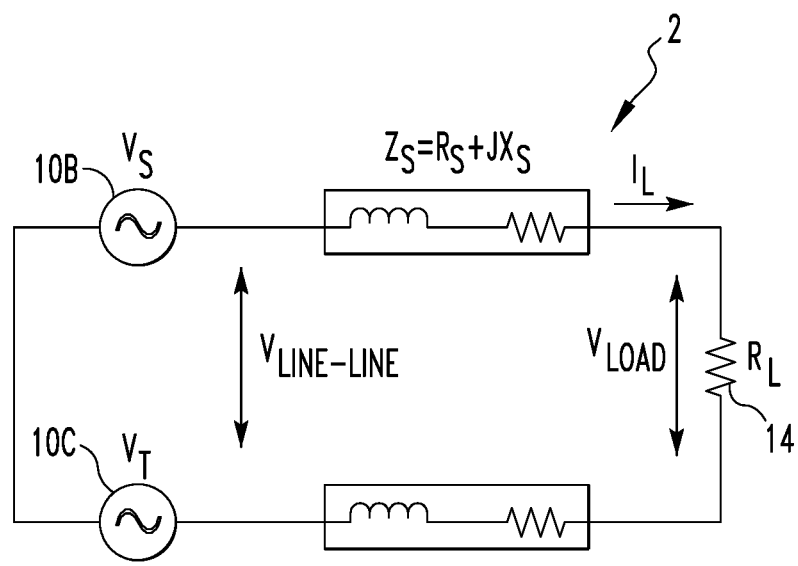

The line-to-line method will be described in connection with an exemplary electrical system 2 shown in FIG. 1A, which is redrawn in part in FIG. 1B. Referring to FIG. 1A and FIG. 1B, electrical system 2 includes a three phase low voltage network 4 that is connected to a three phase load 6. Network 4 includes an AC source 10A ($V_R$) connected to a phase line 12A, an AC source 10B ($V_S$) connected to a phase line 12B, and an AC source 10C ($V_T$) connected to a phase line 12C. Each phase line 12A, 12B and 12C has an associated total effective impedance for the phase, $Z_S$, wherein $Z_S = R_S + jX_S$. As seen in FIG. 1A and FIG. 1B, and according to an aspect of the disclosed concept, a test resistor 14 ($R_L$) is connected between two phase lines (phase line 12A and phase line 12B in the illustrated example), such as through a mechanism like a solid state switch (not shown). As described in detail elsewhere herein, in particular exemplary embodiments, test resistor 14 is connected between the two phase lines for a predetermined period of time, such as, without limitation, a half cycle of the associated source voltage. As will be appreciated, a loop current, $I_L$, will flow line to line as shown (an arbitrary direction of current is shown in the FIG. 1A).

A. Empirical Solution

According to an empirical solution of the present embodiment of the disclosed concept:

$$I_L = \frac{V_S - V_T}{Z_{eq}} = \frac{V_{Line-Line}(\text{nominal})}{2Z_s + Z_L} \qquad (1)$$

In the present empirical solution, $Z_L = R_L$, and $Z_{eq}$ is the total equivalent impedance in the loop shown including test resistor 14 in FIG. 1B (i.e., $Z_{eq}$ equals $Z_S$ of the two phases in the loop and $Z_L$ of test resistor 14). In addition, $Z_s$ can be calculated from the above equation since the measured current $I_L$ (=$V_{drop}/R_L$) is known and $Z_L = R_L$. The $I_{PSC}$ (Line to Earth) is calculated as follows:

$$I_{PSC}(\text{Line} - \text{Earth}) = \frac{V_{Ph}}{Z_s}, \qquad (2)$$

whereas, the $I_{PSC}$ (Line to Line) is calculated as follows:

$$I_{PSC}(\text{Line} - \text{Line}) = \frac{V_{Line}}{2Z_s} = \frac{\sqrt{3}}{2}\frac{V_{Ph}}{Z_s}. \qquad (3)$$

Equation (1) above is valid only if $Z_s$ contains negligible reactance. However, in practical cases, there is some source reactance (e.g., the reactance of the secondary of a transformer), so use of equation (1) can, in practice, produce erroneous results.

In order to address this potential for erroneous results, provided below, according to a further aspect of the disclosed concept, is a more a precise solution for power factors of 0.7 and 0.9 wherein the neglected reactance is incorporated for additional precision.

B. Precise Solution—Power Factor 0.7

In the precise solution of the present embodiment of the disclosed concept, instead of equation (1), $I_L$ will follow the relation below (see FIG. 1B):

$$Z_{eq} = \sqrt{(2R_s + R_L)^2 + (2X_s)^2} \qquad (4)$$

$$I_L = \frac{V_S - V_T}{Z_{eq}} = \frac{V_{Line-Line}}{\sqrt{(2R_s + R_L)^2 + (2X_s)^2}}. \qquad (5)$$

From the measured results:

$$Z_{eq} = \frac{V_{Line}(\text{nominal})}{I_{Loop}(\text{measured})}. \qquad (6)$$

Now, in equation (4), there are two unknown variables, $R_s$ and $X_s$. $Z_{eq}$ can be calculated from relation (6) and $R_L$ is known. In order to reduce the number of unknown variables from two to one, the distribution load power factor 0.7 is considered as follows: pf=cos φ=cos(tan$^{-1}$(X/R)). If pf=0.7, from the above relation X/R=1, or X=R. Hence, putting $R_s = X_s$ in equation (4), the following is obtained: $8R_s^2 + 4R_L R_s + (R_L^2 - Z_{eq}^2) = 0$. This is a simple quadratic equation, which is solved for positive values of $R_s$, so that $Z_s$ can be calculated from equation (7) below:

$$Z_s = \sqrt{(R_s^2 + X_s^2)} = \sqrt{2}R_s, \qquad (7)$$

and subsequently line to line $I_{PSC}$ for the precise solution can be calculated from Equation (3) above.

C. Precise Solution—Power Factor 0.9

Alternatively, the distribution load power factor 0.9 is considered as follows: If pf=0.9, X/R=0.48, or X=0.48R; Hence putting $R_s = 0.48 X_s$ in equation (5), the following is obtained: $4.92 R_s^2 + 4 R_L R_s + (R_L^2 - Z_{eq}^2) = 0$. This is again a quadratic equation, which is solved for positive value of $R_s$, so that $Z_s$ can be calculated from the following relation and subsequently line to line $I_{PSC}$ from equation (3), $$Z_s = \sqrt{R_s^2 + X_s^2} = 1.23 R_s$$

Thus, in short, in the line-to-line method, $I_{PSC}$ is determined according to equation (3) based on $V_{Line}$ and $Z_S$. $V_{Line}$ is determined by measuring the voltage across test resistor 14 that is provided between two phases. $Z_S$ (the total effective impedance for the phase) is calculated for the circuit from a value of $R_S$ (the total effective resistance for the phase) that is determined for the circuit. $R_S$ is calculated as described herein (by solving a simple quadratic equation) based on the known resistance, $R_L$, of test resistor 14, and a value of $Z_{eq}$ (the total equivalent impedance in the loop) that is calculated as described herein based on the known nominal line voltage and the measured loop current for the circuit.

II. The Line-to-Neutral Method

Figure 2A:
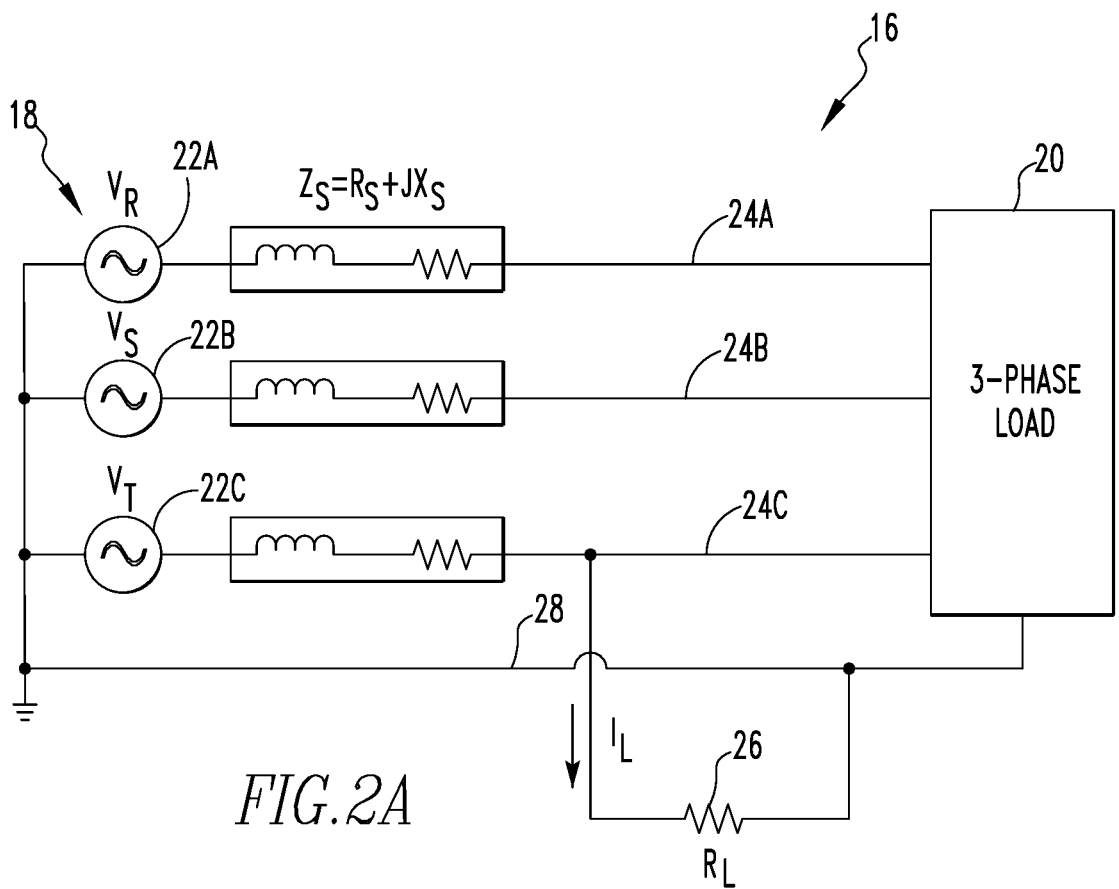
FIGS. 2A and 2B are schematic circuit diagrams of an electrical system which illustrate a method of determining the PSC current according to another, alternative exemplary embodiment of the disclosed concept.
Figure 2B:
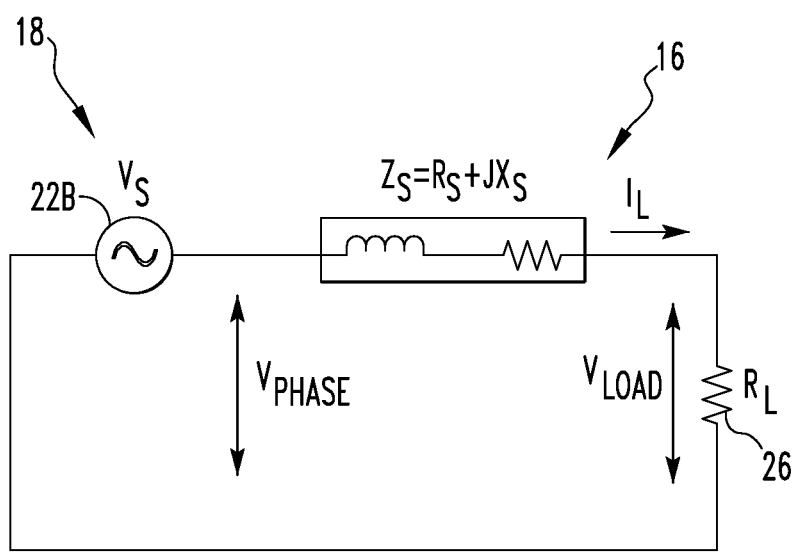

The line-to-neutral method will be described in connection with an exemplary electrical system 16 shown in FIG. 2A, which is redrawn in part in FIG. 2B. Referring to FIG. 2A and FIG. 2B, electrical system 16 includes a three phase low voltage network 18 that is connected to a three phase load 20. Network 18 includes an AC source 22A ($V_R$) connected to a phase line 24A, an AC source 22B ($V_S$) connected to a phase line 24B, and an AC source 22C ($V_T$) connected to a phase line 24C. Each phase line 24A, 24B and 24C has an associated total effective impedance for the phase, $Z_S$, wherein $Z_S = R_S + jX_S$. As seen in FIG. 2A and FIG. 2B, and according to an aspect of the disclosed concept, a test resistor 26 ($R_L$) is connected between a phase line (phase line 22C in the illustrated example) and a neutral line 28, such as through a mechanism like a solid state switch (not shown). As described in detail elsewhere herein, in particular exemplary embodiments, test resistor 26 is connected between the phase and neutral lines for a predetermined period of time, such as, without limitation, a half cycle of the associated source voltage. As will be appreciated, a loop current, $I_L$, will flow line to neutral as shown (an arbitrary direction of current is shown in the FIG. 2A).

A. Empirical Solution

According to an empirical solution of the present embodiment of the disclosed concept:

$$I_L = \frac{V_S}{Z_{eq}} = \frac{V_{Ph}}{Z_s + Z_L} = \frac{V_{Ph}}{Z_s + R_L} \tag{9}$$

In the present empirical solution, $Z_L = R_L$, and $Z_{eq}$ is the total equivalent impedance in the loop shown including test resistor 14 in FIG. 2B (i.e., $Z_{eq}$ equal $Z_S$ of the phase in the loop and $Z_L$ of test resistor 14). $Z_s$ in this case (line to neutral loop) is the sum of impedance of the phase wire (24C) and the neutral wire (28). It can be calculated from the above equation as the measured current $I_L$ is known and $Z_L = R_L$. $I_{PSC}$ is calculated as follows:

$$I_{PSC} = \frac{V_{Ph}}{Z_S} \tag{10}$$

Solving equation (9) for $Z_s$, the following is obtained:

$$Z_s = \frac{V_{Ph} - I_L R_L}{I_L} = \frac{V_{Ph} - V_L}{I_L}$$

Putting this value of $Z_s$ in equation (10), the following is obtained:

$$I_{PSC} = \frac{V_{Ph}}{\frac{V_{Ph} - V_L}{I_L}} = \frac{I_L}{\frac{V_{Ph} - V_L}{V_{Ph}}} = \frac{I_L}{\%V_{drop}}$$

However, equation (9) is valid only if $Z_S$ contains negligible reactance. In practical cases, there is some source reactance (e.g., the reactance of the secondary of a transformer), so equation (9) can produce erroneous results. In order to address this potential for erroneous results, provided below, according to a further aspect of the disclosed concept, is a more a precise solution for power factors of 0.7 and 0.9 wherein the neglected reactance is incorporated for additional precision.

B. Precise Solution—Power Factor 0.7

In the precise solution of the present embodiment of the disclosed concept, instead of equation (9), $I_L$ will follow the following relation:

$$Z_{eq} = \sqrt{(R_s + R_L)^2 + (X_s)^2} \tag{11}$$

$$I_L = \frac{V_T}{Z_{eq}} = \frac{V_{Ph}}{\sqrt{(R_s + R_L)^2 + (X_s)^2}} \tag{12}$$

From the measured results:

$$Z_{eq} = \frac{V_{Phase}(\text{nominal})}{I_{Loop}(\text{measured})} \tag{13}$$

Now, in equation (11), there are two unknown variables, $R_s$ and $X_s$. $Z_{eq}$ can be calculated from relation (13) and $R_L$ is already known. In order to reduce the unknown variables from two to one, the distribution load power factor 0.7 is considered as follows: $pf = \cos \phi = \cos(\tan^{-1}(X/R))$. If $pf=0.7$, $X/R=1$, or $X=R$. Hence, putting $R_s = X_s$ in equation (11), the following is obtained: $2R_s^2 + 2R_L R_s + (R_L^2 - Z_{eq}^2) = 0$. This is a simple quadratic equation, which is solved for positive value of $R_s$, so that $Z_s$ can be calculated from the following relation (14) and Ipso from equation (10):

$$Z_s = \sqrt{R_s^2 + X_s^2} = \sqrt{2} R_s. \tag{14}$$

C. Precise Solution—Power Factor 0.9

Alternatively, the distribution load power factor 0.9 is considered as follows: if $pf=0.9$, $X/R=0.48$, or $X=0.48R$. Hence, putting $R_s = 0.48 X_s$ in equation (11), the following is obtained: $1.23 R_s^2 + 2R_L R_s + (R_L^2 - Z_{eq}^2) = 0$. This is again a quadratic equation, which is solved for positive value of $R_s$, so that $Z_s$ can be calculated from the following relation (15) and $I_{PSC}$ from equation (10):

$$Z_s = \sqrt{R_s^2 + X_s^2} = \sqrt{1.23} R_s. \tag{15}$$

Thus, in short, in the line-to-neutral method, $I_{PSC}$ is determined according to equation (10) based on $V_{Ph}$ and $Z_S$. $V_{Ph}$ is determined by measuring the voltage across test resistor 14 that is provided between a phase line and the neutral line. $Z_S$ (the total effective impedance for the phase) is calculated for the circuit from a value of $R_S$ (the total effective resistance for the phase) that is determined for the circuit. $R_S$ is calculated as described herein (by solving a simple quadratic equation) based on the known resistance, $R_L$, of test resistor 14, and a value of $Z_{eq}$ (the total equivalent impedance in the loop) that is calculated as described herein based on the known nominal phase voltage and the measured loop current for the circuit.

As described above, in the exemplary embodiment, in both the line-to-line method and the line-to-neutral method, the test load (e.g., test resistor 14 or 26) is connected through a solid state switch. The voltage drop across the solid state switch is not considered in the above calculations. However, for increased precision, the impedance of the solid state switch should be excluded from the total calculated impedance $Z_S$. Specifically, in one particular embodiment, the impedance of the solid state switch is determined and that value is subtracted from the calculated $Z_S$ (see above) to create a modified $Z_S$ (i.e., $Z_S$-$Z_{switch}$). The modified $Z_S$ is then used to calculate $I_{PSC}$ as described herein.

There are various ways to determine the impedance of the solid state switch. In the exemplary embodiment, the solid state switch is made up of two thyristors. The voltage drop across the thyristors ($V_T$) is determined from the corresponding value of the loop current $I_L=I_T$ (=voltage drop across loop resistor/loop resistor value in ohms). Then, the impedance of the solid state switch is determined from the following relation:

$$Z_{switch} = \frac{V_T}{I_T} \quad (16)$$

Since the curve of the forward characteristic of the thyristors is known to be non-linear, the switch impedance is not constant and needs to be determined for each loop current value.

III. Exemplary Implementations

Figure 3:
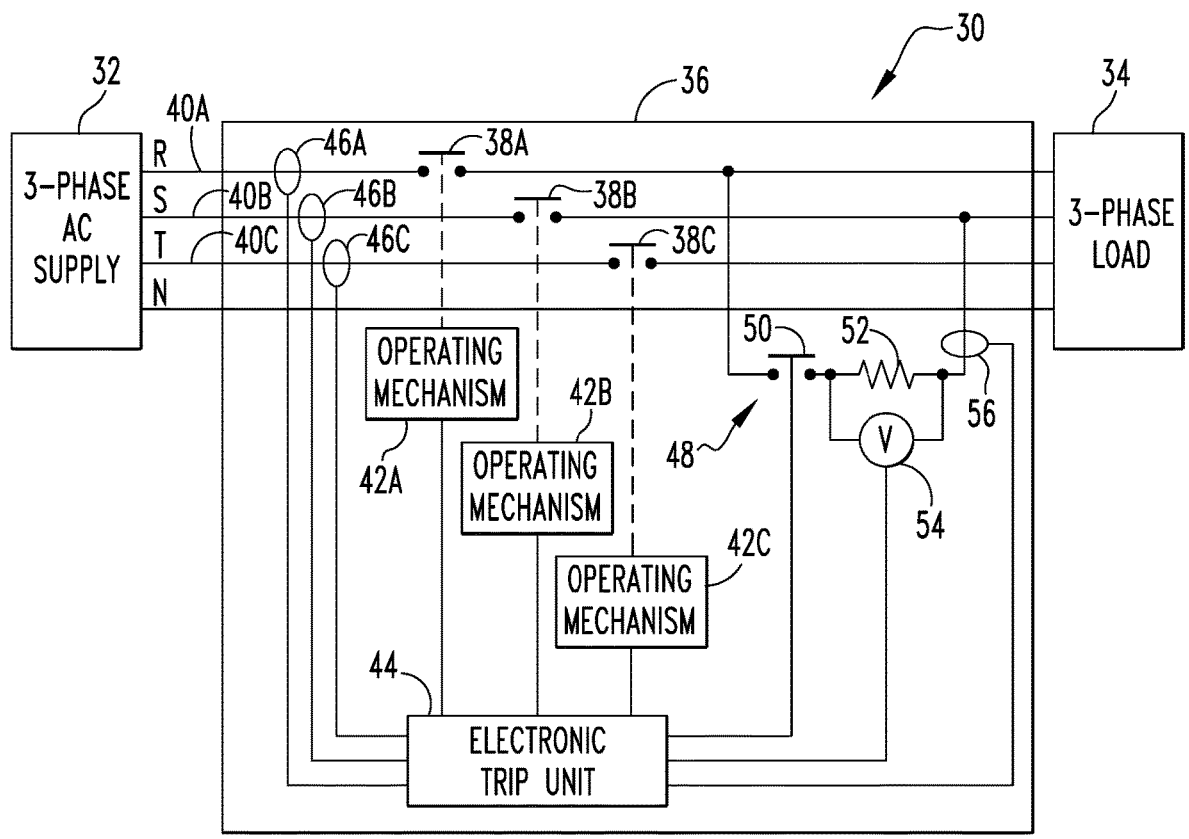
FIG. 3 is a schematic diagram of an electrical system according to an exemplary embodiment that includes a circuit breaker that implements a line-to-line method of PSC current determination of the disclosed concept.

FIG. 3 is a schematic diagram of an electrical system 30 according to one particular, non-limiting exemplary embodiment of the disclosed concept. As seen in FIG. 3, electrical system 30 includes a 3-phase AC supply 32, a 3-phase load 34, and a circuit breaker 36 provided between 3-phase AC supply 32 and 3-phase load 34. As described in detail below, circuit breaker 36 is structured and configured to provide overcurrent protection to 3-phase load 34. In addition, as also described in detail below, circuit breaker 36 is further structured and configured to implement the line-to-line method of determining PSC current of the disclosed concept that is described in detail elsewhere herein.

Referring to FIG. 3, circuit breaker 36 includes separable contacts 38A, 38B, and 38C, operating mechanisms 42A, 42B, and 42C, an electronic trip unit 44, and current sensors 46A, 46B and 46C. As seen in FIG. 3, separable contacts 38A are provided in a first phase line 40A of electrical system 30, separable contacts 38B are provided in a second phase line 40B of electrical system 30, and separable contacts 38C are provided in a third phase line 40C of electrical system 30. Each operating mechanism 42A, 42B, 42C is structured to, under the control of electronic trip unit 44, open and close the associated separable contacts 38A, 38B, 38C. More specifically, electronic trip unit 44 is structured and configured to control each of the operating mechanisms 42A, 42B, 42C to trip open the associated separable contact 38A, 38B, 38C when, as described below, conditions dictate that such opening is necessary based on the outputs of current sensors 46A, 46B and 46C.

Figure 4:
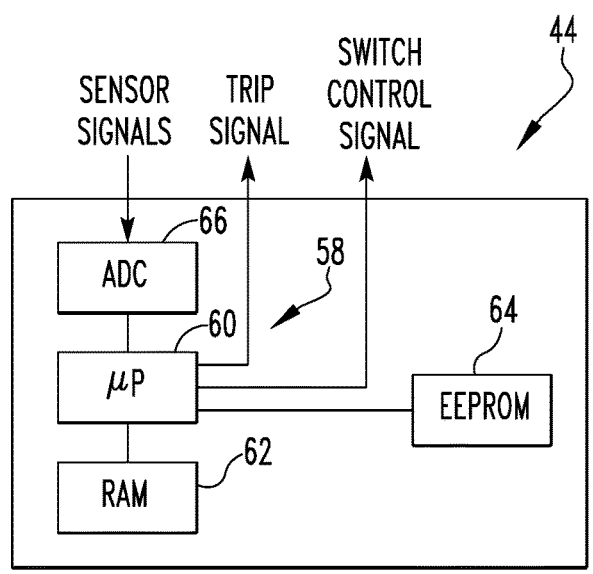
FIG. 4 is a schematic diagram of an electronic trip unit that may be employed to implement the disclosed concept.

FIG. 4 is a schematic diagram showing certain selected components of electronic trip unit 44 according to the exemplary embodiment. As seen in FIG. 4, electronic trip unit 44 includes a controller 58 comprising a microprocessor (µP) 60 and a memory portion including a random access memory (RAM) 62 and an EEPROM 64. Electronic trip unit 44 further includes an analog-to-digital converter (ADC) 66 that is structured to receive the output signals from current sensors 46A, 46B and 46C and convert those signals to digital data that is appropriate for microprocessor 60. RAM 62 stores a trip unit program that is executable by microprocessor 60. The trip unit program includes a number of routines that are configured to determine whether and when to issue a trip signal for tripping each of the operating mechanisms 42A, 42B, 42C based upon the current sensed by each of the current sensors 46A, 46B, 46C. In addition, EEPROM 64 stores (in nonvolatile memory) the functional trip settings of electronic trip unit 44 which define the operating characteristics thereof, and which are read into microprocessor 60 as needed by the trip unit program.

In addition, referring again to FIG. 3, circuit breaker 36 further includes additional circuitry for implementing the line-to-line method for determining $I_{PSC}$ of the disclosed concept. In particular, circuit breaker 36 includes a loop circuit 48 that is provided between the phase line 40A and the phase line 40B in the illustrated example. Loop circuit 48 includes a solid state switch 50, a test resistor 52, a voltage sensor 54 coupled to measure the voltage drop across the test resistor 52, and a current sensor 56 coupled to measure the loop current flowing through loop circuit 48. Solid state switch 50 is connected to and is controlled by (i.e., opened and closed by) electronic trip unit 44. In addition, both voltage sensor 54 and current sensor 56 are connected to electronic trip unit 44 (through ADC 66) such that the output signals thereof are provided to electronic trip unit 44. Note that, while only one loop circuit 48 is shown in FIG. 3 for ease of illustration, it will be understood that additional loop circuits 48 provided between the phase line 46A and phase line 46C and/or in between phase line 46B and phase line 46C for making $I_{PSC}$ measurements based thereon may also be included within the scope of the disclosed concept.

Furthermore, according to an aspect of the exemplary embodiment, RAM 62 stores a number of routines which are executable by microprocessor 60 which implement the line-to-line method of the disclosed concept for determining PSC current using the circuitry of loop circuit 48 described above. In particular, the routines are structured and configured to control circuit breaker 36 to operate as follows. When PSC current is to be measured, electronic trip unit 44 will issue a switch control signal (FIG. 4) which causes solid state switch 50 to be closed for a predetermined number of periods (e.g., multiple periods), with each period being of a predetermined duration. In the non-limiting, exemplary embodiment, each period is a positive (or negative) half cycle of the applied AC voltage. For each period during which solid state switch 50 is closed, the following parameters are determined/measured: (i) the nominal line-to-line voltage for loop circuit 48 (e.g., measured continuously in electronic trip unit 44), (ii) the loop current, $I_L$, through loop circuit 48, and (iii) the voltage drop, $V_{LINE}$, across loop resistor 52 of loop circuit 48. Then, each of those measured values during multiple periods is averaged to provide an average nominal line-to-line voltage, an average $V_{LINE}$, and an average $I_L$. Next, $Z_S$ is calculated as described herein using the average nominal line-to-line voltage and the average $I_L$. Finally, $I_{PSC}$ is calculated as described herein using the average $V_{LINE}$ and the calculated $Z_S$.

It will be appreciated that the exemplary embodiment just described that employs average values for nominal line-to-line voltage, $I_L$ and $V_{LINE}$ is meant to be exemplary only, and that single measurements of those values as opposed to averages may also be employed within the scope of the disclosed concept. Furthermore, while the exemplary embodiment makes measurements over multiple positive half cycle of the applied AC voltage, it will also be understood that that is meant to be exemplary only and that measurements may also be made over negative half cycles instead of or in addition to the positive half cycles. In fact, an implementation that uses both positive and opposite, negative half cycles may account for differences (i.e., imbalances) in the source impedance, and therefore may be advantageous.

Figure 5:
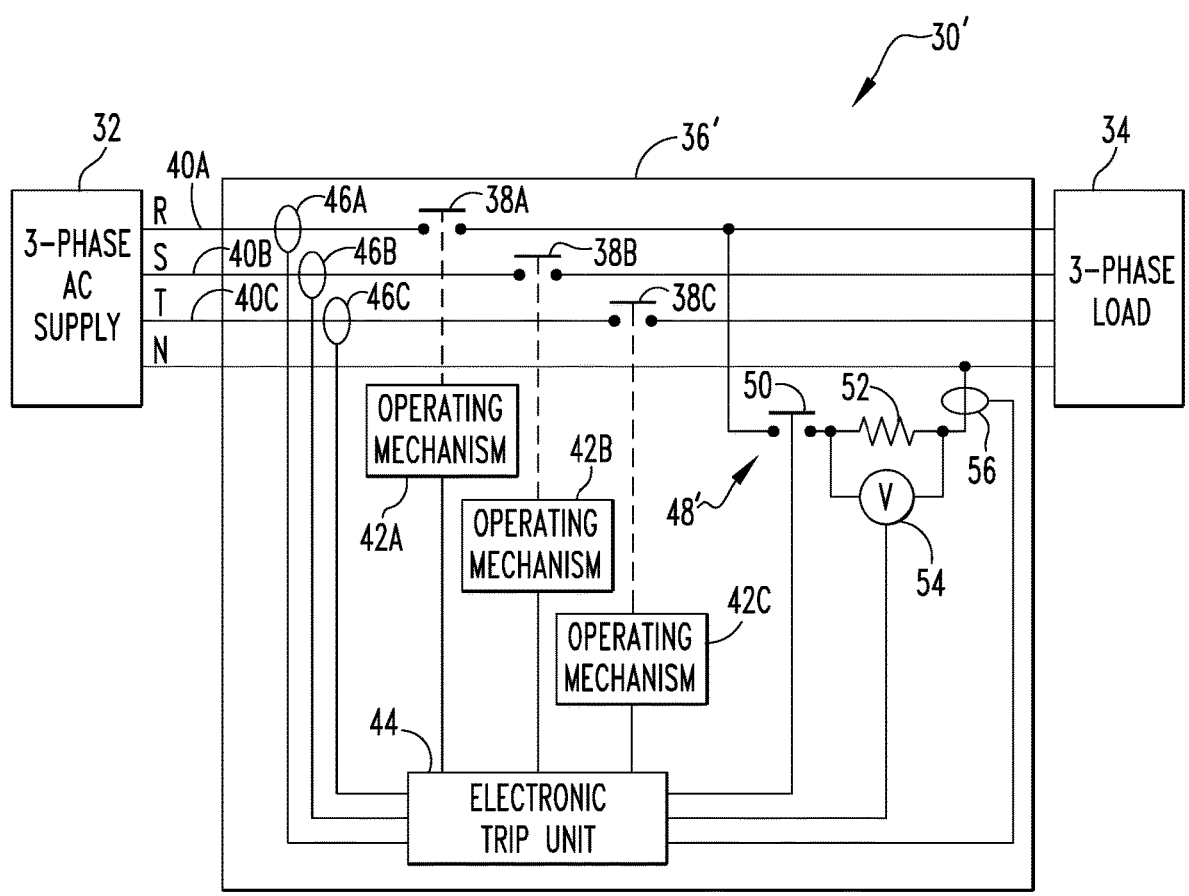
FIG. 5 is a schematic diagram of an electrical system according to an alternative exemplary by that includes a circuit breaker that implements a line-to-neutral method of PSC current determination of the disclosed concept.

FIG. 5 is a schematic diagram of an electrical system 30' according to an alternative particular, non-limiting exemplary embodiment of the disclosed concept. Electrical system 30' is similar to electrical system 30 described above, and like components are labeled with like reference numerals. However, electrical system 30' is structured and configured to implement the line-to-neutral method of determining PSC current of the disclosed concept that is described in detail elsewhere herein.

In particular, electrical system 30' includes an alternative circuit breaker 36' that is similar to circuit breaker 36, except that it includes a loop circuit 48' that is provided between phase line 40A and the neutral line. In this alternative embodiment, RAM 62 stores a number of routines which are executable by microprocessor 60 which implement the line-to-neutral method of the disclosed concept for determining PSC current using the circuitry of loop circuit 48'. In particular, the routines are structured and configured to control circuit breaker 36' to operate as follows. When PSC current is to be measured, electronic trip unit 44 will issue a switch control signal (FIG. 4) which causes solid state switch 50 to be closed for a predetermined number of periods (e.g., multiple periods), with each period being of a predetermined duration. In the non-limiting, exemplary embodiment, each period is a positive half cycle of the applied AC voltage. For each period during which solid state switch 50 is closed, the following parameters are determined/measured: (i) the nominal phase voltage for loop circuit 48' (e.g., measured continuously in electronic trip unit 44), (ii) the loop current, $I_L$, through loop circuit 48', and (iii) the voltage drop, $V_{Ph}$, across loop resistor 52 of loop circuit 48'. Then, each of those measured values is averaged to provide an average nominal phase voltage, an average $V_{Ph}$, and an average $I_L$. Next, $Z_S$ is calculated as described herein using the average nominal phase voltage and the average $I_L$. Finally, $I_{PSC}$ is calculated as described herein using the average $V_{Ph}$ and the calculated $Z_S$.

As was the case with electrical system 30 described above, it will be appreciated that the exemplary embodiment just described that employs average values for nominal phase voltage, $I_L$ and $V_{Ph}$ is meant to be exemplary only, and that single measurements of those values as opposed to averages may also be employed within the scope of the disclosed concept. Furthermore, while the exemplary embodiment makes measurements over multiple positive half cycle of the applied AC voltage, it will also be understood that that is meant to be exemplary only and that measurements may also be made over negative half cycle instead of or in addition to the positive half cycles.

In addition, in further alternative embodiments, electronic trip unit 44 in either circuit breaker 36 or circuit breaker 36' is further structured and configured to adjust the functional trip settings stored in EEPROM 64 and used by the trip program of electronic trip unit 44 based on the determined $I_{PSC}$.

Moreover, in still a further embodiment, circuit breaker 36 and circuit breaker 36' may be combined to form a device that implements both the line-to-line method and the line-to-neutral method of the disclosed concept by including loop circuits 48 and 48' described herein in a single device.

It will be understood that circuit breakers 36 and 36' are described herein in order to provide exemplary implementations of an electrical device in which the disclosed concept may be implemented. It will be understood, however, that that is meant to be exemplary only and that the methods of the disclosed concept may alternatively be integrated into electrical devices other than circuit breakers, such as, without limitation, protective relays or metering devices.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of determining a prospective short circuit current for an electrical system including a source and based on a power factor of either 0.7 or 0.9, comprising
   connecting a test load between either: (i) a first phase line and a second phase line of the electrical system or (ii) the first phase line and a neutral line of the electrical system;
   employing a sensor coupled to the electrical system to measure a voltage drop across the test load;
   determining a voltage value based on at least the measured voltage drop across the test load;
   determining a total effective impedance ($Z_s$) for the first phase line to the source, wherein $Z_s$ is equal to $Z_S=R_S \pm jX_S$, wherein $R_s$ is a total resistance for the first phase line to the source and $X_s$ is a total reactance for the first phase line to the source, wherein $Z_s$ is calculated from a positive value for $R_s$ that is determined by solving a quadratic equation for $R_s$, and wherein the quadratic equation is selected from the following quadratic equations:

$$8R_s^2+4R_LR_s+(R_L^2-Z_{eq}^2)=0,$$

$$4.92R_s^2+4R_LR_s+(R_L^2-Z_{eq}^2)=0,$$

$$2R_s^2+2R_LR_s+(R_L^2-Z_{eq}^2)=0, \text{ and}$$

$$1.23R_s^2+2R_LR_s+(R_L^2-Z_{eq}^2)=0,$$

wherein $R_L$ is a resistance of the test load and wherein $Z_{eq}$ is an equivalent impedance value that is calculated based on either (i) a nominal line-to-line voltage for the electrical system and a current flowing through the test load, or (ii) a nominal phase voltage for the electrical system and the current flowing through the test load; and
   determining the prospective short circuit current based on the voltage value and the total effective impedance.

2. The method according to claim 1, wherein the connecting comprises connecting the test load between the first phase line and the second phase line by closing a switch provided between the first phase line and the second phase line, and wherein the quadratic equation is selected from:

$$8R_s^2+4R_LR_s+(R_L^2-Z_{eq}^2)=0, \text{ and}$$

$$4.92R_s^2+4R_LR_s+(R_L^2-Z_{eq}^2)=0.$$

3. The method according to claim 2, further comprising employing a current sensor coupled to the electrical system to determine the current flowing through the test load when the test load is connected between the first phase line and the second phase line.

4. The method according to claim 1, wherein the connecting comprises connecting the test load between the first phase line and the neutral line by closing a switch provided between the first phase line and the neutral line, and wherein the quadratic equation is selected from:

$$2R_s^2+2R_LR_s+(R_L^2-Z_{eq}^2)=0, \text{ and}$$

$$1.23R_s^2+2R_LR_s+(R_L^2-Z_{eq}^2)=0.$$

5. The method according to claim 4, further comprising employing a current sensor coupled to the electrical system to determine the current flowing through the test load when the test load is connected between the first phase line and the neutral line.

6. The method according to claim 1, wherein the test load is a test resistor.

7. The method according to claim 1, wherein the connecting the test load, the employing the sensor, the determining the voltage value, the determining the total effective impedance, and the determining the prospective short-circuit current are all performed within a circuit protection device coupled to the electrical system between the source and a load.

8. The method according to claim 7, wherein the circuit protection device is a circuit breaker.

9. An electrical device structured to be coupled to an electrical system between a source and a load and structured and configured to determine a prospective short circuit current for the electrical system based on a power factor of either 0.7 or 0.9, comprising:
   a test load;
   a switch structured to selectively connect the test load between either: (i) a first phase line and a second phase line of the electrical system or (ii) the first phase line and the neutral line of the electrical system;
   a sensor structured to generate a signal indicative of a voltage drop across the test load; and
   a controller structured and configured to:
      determine a voltage value based on at least the signal indicative of a voltage drop across the test load,
      determine a total effective impedance ($Z_s$) for the first phase line, wherein $Z_s$ is equal to $Z_S=R_S+jX_S$, wherein $R_s$ is a total resistance for the first phase line to the source and $X_s$ is a total reactance for the first phase line to the source, wherein $Z_s$ is calculated from a positive value for $R_s$ that is determined by solving a quadratic equation for $R_s$, and wherein the quadratic equation is selected from the following quadratic equations:

$$8R_s^2+4R_LR_s+(R_L^2-Z_{eq}^2)=0,$$

$$4.92R_s^2+4R_LR_s+(R_L^2-Z_{eq}^2)=0,$$

$$2R_s^2+2R_LR_s+(R_L^2-Z_{eq}^2)=0, \text{ and}$$

$$1.23R_s^2+2R_LR_s+(R_L^2-Z_{eq}^2)=0,$$

wherein $R_L$ is a resistance of the test load and wherein $Z_{eq}$ is an equivalent impedance value that is calculated based on either (i) a nominal line-to-line voltage for the electrical system and a current flowing through the test load, or (ii) a nominal phase voltage for the electrical system and the current flowing through the test load
   determine the prospective short circuit current for the electrical system based on the voltage value and the total effective impedance.

10. The electrical device according to claim 9, wherein the electrical device is a circuit protection device.

11. The electrical device according to claim 10, wherein the electrical device is a circuit breaker.

12. The electrical device according to claim 9, wherein the switch is structured to selectively connect the test load between the first phase line and the second phase line, the electrical device further comprising a current sensor structured to determine the current flowing through the test load when the test load is connected between the first phase line and the second phase line, and wherein the quadratic equation is selected from:

$$8R_s^2+4R_LR_s+(R_L^2-Z_{eq}^2)=0, \text{ and}$$

$$4.92R_s^2+4R_LR_s+(R_L^2-Z_{eq}^2)=0.$$

13. The electrical device according to claim 9, wherein the switch is structured to selectively connect the test load between the first phase line and the neutral line, the electrical device further comprising a current sensor structured to determine the current flowing through the test load when the test load is connected between the first phase line and the neutral line, and wherein the quadratic equation is selected from:

$$2R_s^2+2R_LR_s+(R_L^2-Z_{eq}^2)=0, \text{and}$$

$$1.23R_s^2+2R_LR_s+(R_L^2-Z_{eq}^2)=0.$$

14. The electrical device according to claim 9, wherein the test load is a test resistor.

15. The electrical device according to claim 9, wherein the controller is structured to adjust an operational parameter of the electrical device based on the determined prospective short circuit current.

16. The electrical device according to claim 15, wherein the electrical device is a circuit breaker and wherein the controller is structured to adjust functional trip settings of the circuit breaker based on the determined prospective short circuit current.

* * * * *